(12) United States Patent
Hung (10) Patent No.: US 7,417,476 B1
(45) Date of Patent: Aug. 26, 2008

(54) POWER-ON-RESET CIRCUIT WITH OUTPUT RESET TO GROUND VOLTAGE DURING POWER OFF

(75) Inventor: Kenneth Wai Ming Hung, Hong Kong (HK)

(73) Assignee: Smartech Worldwide Limited, Hong Kong (CN)

( * ) Notice: Subject to any disclaimer, the term of this patent is extended or adjusted under 35 U.S.C. 154(b) by 0 days.

(21) Appl. No.: 11/739,202

(22) Filed: Apr. 24, 2007

(51) Int. Cl.
*H03K 7/00* (2006.01)
*H03K 3/02* (2006.01)

(52) U.S. Cl. .................... 327/143; 327/142; 327/198

(58) Field of Classification Search ............ 327/142, 327/143, 198
See application file for complete search history.

(56) References Cited

U.S. PATENT DOCUMENTS

| | | | |
|---|---|---|---|
| 4,717,840 A | 1/1988 | Ouyang | |
| 5,469,099 A * | 11/1995 | Konishi | 327/198 |
| 5,534,804 A | 7/1996 | Woo | |
| 5,847,586 A * | 12/1998 | Burstein et al. | 327/143 |
| 5,936,443 A * | 8/1999 | Yasuda et al. | 327/143 |
| 6,005,423 A * | 12/1999 | Schultz | 327/143 |
| 6,137,324 A | 10/2000 | Chung | |
| 6,144,237 A | 11/2000 | Ikezaki | |
| 6,160,431 A * | 12/2000 | Crotty | 327/143 |
| 6,259,285 B1 * | 7/2001 | Woods | 327/143 |
| 6,492,850 B2 * | 12/2002 | Kato et al. | 327/143 |
| 6,518,746 B2 * | 2/2003 | McClure | 324/158.1 |
| 6,683,481 B1 * | 1/2004 | Zhou et al. | 327/143 |
| 6,768,354 B2 * | 7/2004 | Yamazaki et al. | 327/143 |
| 6,847,240 B1 | 1/2005 | Zhou | |
| 6,873,193 B2 * | 3/2005 | Kinoshita et al. | 327/143 |
| 6,879,194 B1 | 4/2005 | Caldwell | |
| 6,914,462 B2 * | 7/2005 | Kim et al. | 327/143 |
| 6,937,074 B2 * | 8/2005 | Shin | 327/143 |
| 6,972,602 B2 | 12/2005 | Akamatsu | |
| 7,126,391 B1 * | 10/2006 | Smith et al. | 327/143 |
| 7,135,898 B2 | 11/2006 | Tseng | |
| 7,142,024 B2 | 11/2006 | Youssef | |
| 7,161,396 B1 | 1/2007 | Zhou | |
| 2001/0054291 A1 * | 12/2001 | Akiyoshi | 327/143 |
| 2002/0140468 A1 * | 10/2002 | Kato et al. | 327/143 |
| 2003/0011411 A1 * | 1/2003 | Sterrantino et al. | 327/143 |
| 2003/0020525 A1 * | 1/2003 | Shigemasa et al. | 327/143 |
| 2004/0217785 A1 * | 11/2004 | Colbeck et al. | 327/142 |
| 2005/0184770 A1 * | 8/2005 | Sohn et al. | 327/143 |
| 2007/0001720 A1 * | 1/2007 | Li et al. | 327/143 |
| 2007/0001721 A1 * | 1/2007 | Chen et al. | 327/143 |

* cited by examiner

*Primary Examiner*—N. Drew Richards
*Assistant Examiner*—Adam Houston
(74) *Attorney, Agent, or Firm*—Xin Wen (57) ABSTRACT

A power-on reset circuit includes a first circuit arranged between a high voltage supply terminal (VDD) and a low voltage supply terminal (VSS), wherein the first circuit is configured to output a low-voltage reset signal at an output node (PORB) when VDD is powered up and to output a high voltage signal at the node PORB after the VDD reaches a predetermined voltage during power up; a second circuit configured to set the node PORB to a low voltage after VDD is powered off; and a third circuit configured to provide a supply voltage at a node DV to the second circuit. The supply voltage is lower than the voltage of VDD by approximately one diode voltage.

19 Claims, 5 Drawing Sheets

POWER-ON-RESET CIRCUIT WITH OUTPUT RESET TO GROUND VOLTAGE DURING POWER OFF

BACKGROUND

The present disclosure relates to an electric circuit, more particularly, to a power-on reset circuit.

When an electronic device is powered up, a supply voltage VDD for the electronic device rises from zero voltage to a pre-defined voltage (e.g. 3.3V). During this period, logic states of internal latches or flip-flops in the electronic device are un-known because they may carry logic memories from previous logic states. Un-known internal logic states can cause unpredictable behaviors in the electronic device and prevent the electronic device from performing its intended functions. A power-on-reset (POR) circuit can provide reset signals to reset internal latches or flip-flops to well-defined logic states during a power-on period, thus ensuring the proper functions of the electronic device.

Figure 1:
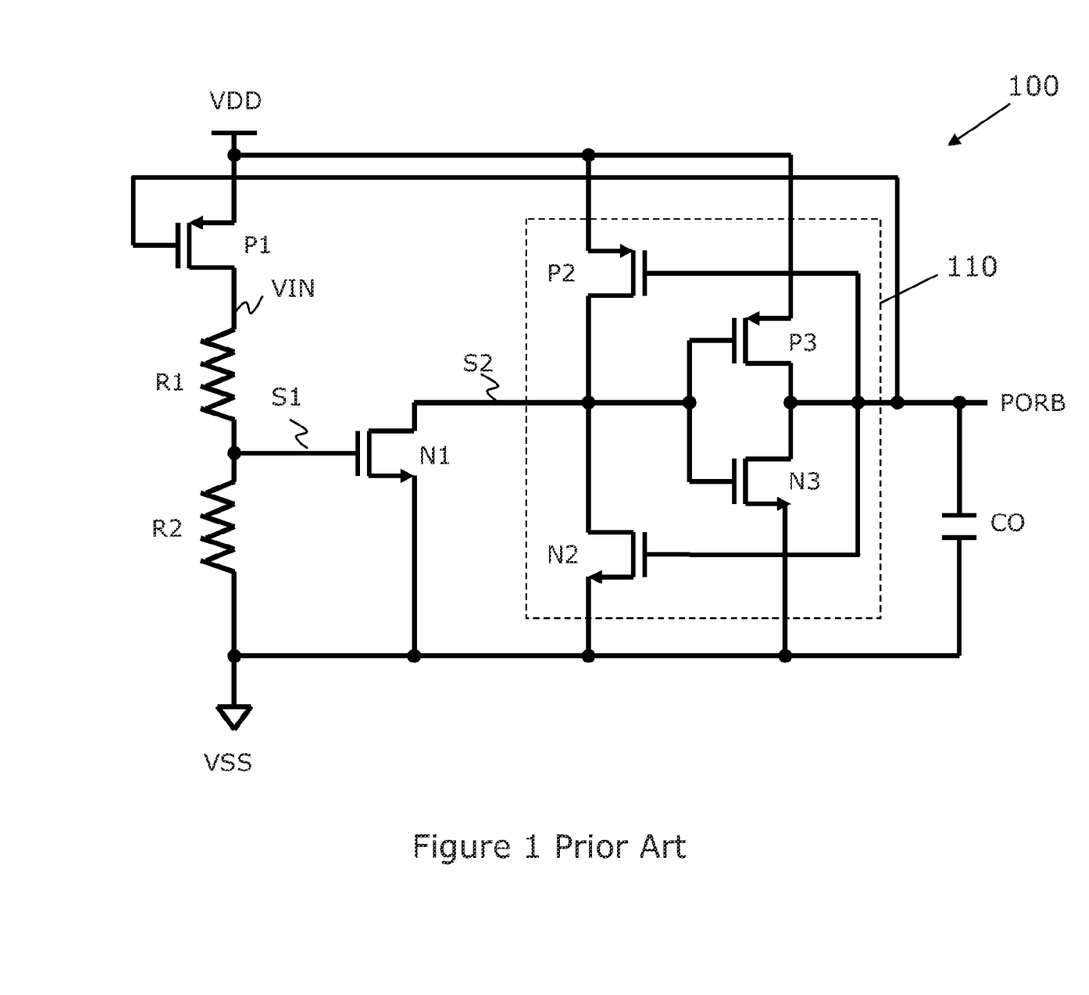
FIG. 1 is a conventional power-on reset circuit.

A conventional POR circuit 100, as shown in FIG. 1, can include a Schmitt trigger circuit 110 consisting of transistors P2/P3/N2/N3, a stabilization capacitor CO, a current source PMOS transistor P1, a resistor divider consisting of resistors R1 and R2, and an NMOS transistor N1. An output signal can be produced at a node PORB for resetting internal logics in an electronic device. The PMOS transistor P1 can provide source current from VDD to the resistor divider. The NMOS transistor N1 can produce a trigger signal at the node S2 for the Schmitt trigger circuit 110. The Schmitt trigger circuit 110 can bypass voltage fluctuations and clamp the voltage of the output node PORB during powers up. The PORB node is initially at ground voltage (which can be defined as zero voltage).

During power on, VDD rises from ground voltage to a pre-defined voltage, say 3.3V. The gate node of PMOS transistor P1 and the gate node of PMOS transistor P2 are both at zero voltage, thus they are both turned on. The current flows through P1 can produce a voltage at the node S1 as defined by $VIN \times R2/(R1+R2)$ where VIN is the drain voltage of P1. The current flows through P2 can cause the voltage at S2 to follow the rise of the voltage supply VDD. The node S2 has a higher voltage than the node S1 as S1 is resistive divided by VDD. NMOS transistor N3 can therefore turn on once the voltage at the node S2 reaches its threshold turn-on voltage. When N3 is turned on, the node PORB is further clamped to zero voltage. When VDD rises up further to reach the threshold turn-on voltage of NMOS transistor N1, N1 is turned on and pulls the node S2 low. At that moment, P2 is already turned on and therefore P2/N1 forms a resistive divider at the node S2. If N1 is made much larger than P2, then the pulling effect to the node S2 is much stronger at N1, the node S2 can be easily pulled to zero voltage, which can shut off the N3 and turns on P3. As a result, the PORB node changes from logic low to logic high. Subsequently P2 is shut off and N2 is turned on by the high logic level at the node PORB. P1 is also shut off, thus preventing direct DC current from flowing through the resistive divider and minimizing power consumption.

A significant drawback associated with the conventional POR circuit 100 is that it may not provide reliable reset signals if VDD has not dropped to zero voltage before the next powers up.

Figure 2A:
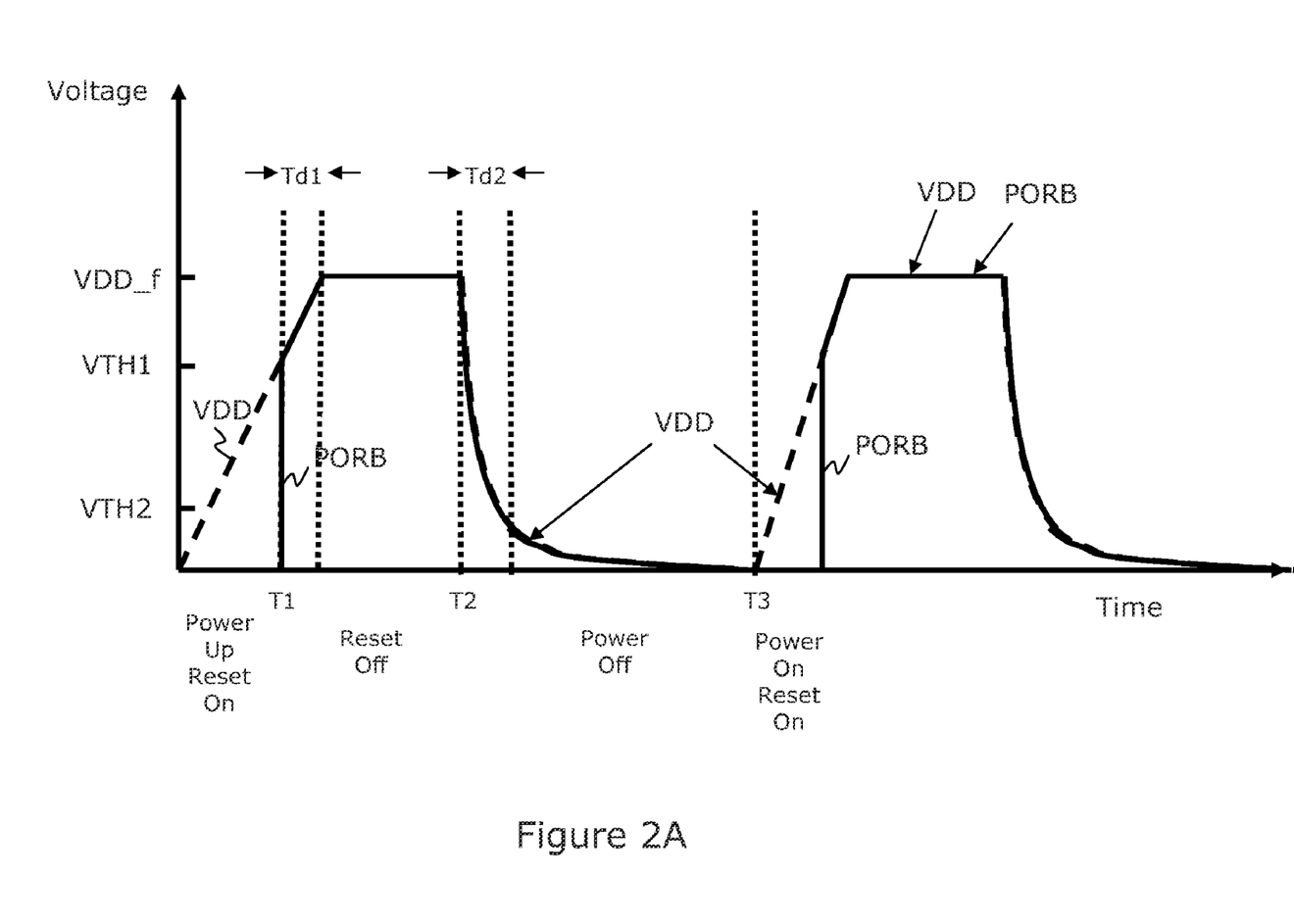
FIG. 2A illustrates voltage waveforms for a proper power cycling sequence in a power-on reset circuit.

FIG. 2A shows the waveform for a proper power cycling sequence. When VDD rises from zero voltage, PORB changes from logic low to logic high after a predetermined time T1. When VDD reaches VTH1, S1 reaches the turn-on threshold of N1; PORB steps up and then follows VDD until VDD reaches to its stable value VDD_f. Td1 is defined as the time during which PORB follows VDD to rise to VDD_f. The period between 0 and T1+Td1 can be called "power on" or "power up".

VDD remains at the VDD_f from T1+Td1 to T2. After T2, the electronic device powers off. VDD decreases following a typical exponential decay curve for an RC circuit. The rate of decrease is fast at the beginning (from time T2 to T2+Td2) and then slows down when it reaches to a low voltage level VTH2 (typically around the parasitic diode voltage). Therefore, the period from T2 to T3 can be very long period. If the next power on occurs long enough after the last power off, the next power-on can be properly reset by the POR circuit, as shown in FIG. 2A.

Figure 2B:
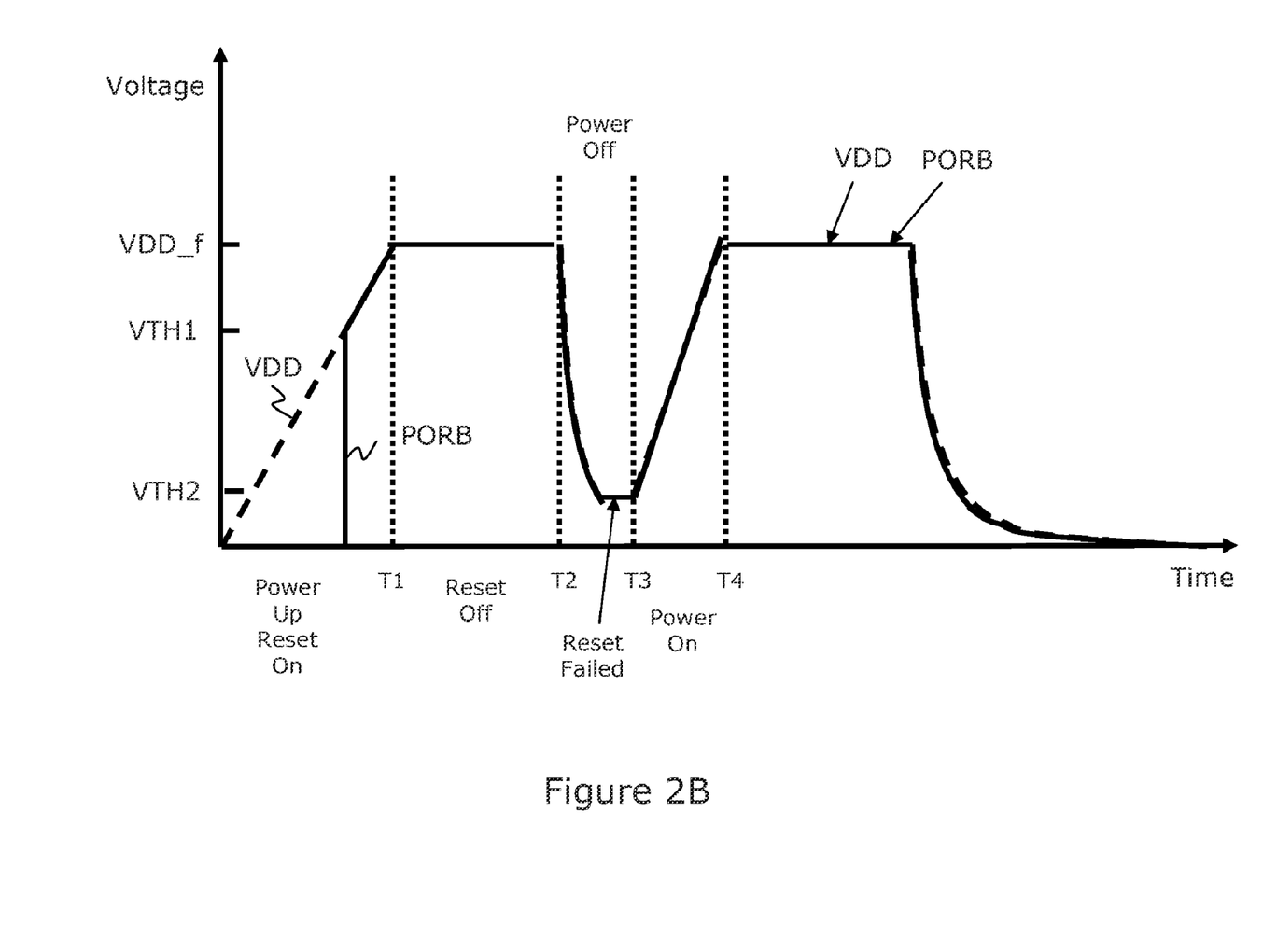
FIG. 2B illustrates voltage waveforms for a malfunctioned power cycling sequence in a conventional power-on reset circuit.

If the next power-on event occurs shortly after the previous power cycle, the next power-on may not be properly reset by the POR circuit. As shown in FIG. 2B, because of the short period of T3−T2, VDD does not have enough time to drop to zero voltage when the next power-on event begins at T3, PORB closely follows VDD. Let us assume VDD and PORB drop to around ~0.6V=VTH2. VDD suddenly rises up again at time T3. At this time, as can be seen in FIG. 1, the gate voltages of PMOS transistors P1/P2 and VDD are at 0.6V. The transistors P1/P2 are therefore shut off. The node S2 is clamped to zero voltage from the previous power-up sequence. Because P2 shuts off, it cannot pull up the node S2 to logic high as in a normal power-on cycle. P1 shuts off and S1 is at zero voltage, thus N1 being held in an off state. S2 is also at zero voltage. P3 is therefore completely turned on and PORB closely follows VDD in the next power-on cycle. In this example, the POR circuit 100 completely fails to produce a reset signal in the second power-on cycle.

There is therefore a need for a POR circuit to perform proper reset functions for fast power cycles. Moreover, it is desirable to eliminate DC current leakage and minimize VDD fluctuations during power-on of a POR circuit.

SUMMARY

In a general aspect, the present invention relates to a power-on reset circuit comprising a first circuit arranged between a high voltage supply terminal (VDD) and a low voltage supply terminal (VSS), wherein the first circuit is configured to output a low-voltage reset signal at an output node (PORB) when VDD is powered up and to output a high voltage signal at the node PORB after the VDD reaches a predetermined voltage during power up; a second circuit configured to set the node PORB to a low voltage after VDD is powered off; and a third circuit configured to provide a supply voltage at a node DV to the second circuit, wherein the supply voltage is lower than the voltage of VDD by approximately one diode voltage.

In another general aspect, the present invention relates to a power-on reset circuit comprising a first circuit arranged between a high voltage supply terminal (VDD) and a low voltage supply terminal (VSS), wherein the first circuit is configured to output a low-voltage reset signal at an output node (PORB) when VDD is powered up and to output a high voltage signal at the node PORB after the VDD reaches a predetermined voltage during power up;

a second circuit comprising a voltage divider configured to output at a node D1 a divided voltage that is a fraction of the supply voltage at a node DV; and a pull-down transistor NS6 connected between the node PORB and VSS, the pull-down transistor being configured to pull the node PORB to a low voltage in response to the divided voltage at the node D1 after VDD is powered off; and a third circuit comprising a diode connected between VDD and the node DV; and a capacitor CS1 connected between the node DV and VSS, wherein the third circuit is configured to provide a supply voltage at the node DV to the second circuit.

In yet another general aspect, the present invention relates to a power-on reset circuit comprising a first circuit configured to output a low-voltage reset signal at an output node (PORB) when a high voltage supply terminal (VDD) is powered up and to output a high voltage signal at the node PORB after the VDD reaches a predetermined voltage during power up;

a second circuit comprising a voltage divider configured to output at a node D1 a divided voltage that is a fraction of the supply voltage at a node DV; and a pull-down transistor NS6 connected between the node PORB and a low voltage supply terminal (VSS), the pull-down transistor being configured to pull the node PORB to a low voltage in response to the divided voltage at the node D1 after VDD is powered off; and a third circuit comprising a diode connected between VDD and the node DV a capacitor CS1 connected between the node DV and VSS; and a transistor NS1b connected between the node DV and VSS and in parallel to the capacitor, wherein the third circuit is configured to provide a supply voltage at the node DV to the second circuit; and an inverter having an input connected to the node PORB and an output connected to the base of the transistor NS1b to allow capacitor CS1 to be discharged when the node PORB is at a low voltage.

Implementations of the system may include one or more of the following. The first circuit can include a transistor connected between VDD and a node S3, an R-C circuit connected between the node S3 and VSS, and a Schmitt trigger circuit configured to change the voltage at PORB in response to the voltage at the node S3. The Schmitt trigger circuit can be triggered by the voltage at the node S3 to change the voltage at PORB when VDD reaches a predetermined voltage during power on. The first circuit can further include a diode connected between the transistor and the node S3, and an inverter having an output connected to the node PORB and an input connected to an output of the Schmitt trigger circuit. The first circuit can further include a capacitor CO connected between the node PORB and VSS. The second circuit can include a voltage divider configured to output at a node D1 a divided voltage that is a fraction of the supply voltage at the node DV; and a pull-down transistor NS6 connected between the node PORB and VSS, the pull-down transistor being configured to pull the node PORB to a low voltage in response to the divided voltage at the node D1 after VDD is powered off. The voltage divider in the second circuit is formed by two transistors connected at the node D1 and between the node DV and VSS. The second circuit can further include one or more sequentially-connected inverters having an input connected to the node D1 and an output connected to the base of the pull-down transistor. The second circuit can further include a clamping transistor NS5 connected between the base of the pull-down transistor NS6 and VSS, wherein the base of the clamping transistor NS5 is supplied with the supply voltage at the node D1. The second circuit can further include a capacitor CS2 connected between VSS and the node D1 and configured to store charges when VDD is powered off. The third circuit can include a diode connected between VDD and the node DV; and a capacitor CS1 connected between the node DV and VSS. The diode can be a diode-connected transistor NS1a. The third circuit can further include a transistor NS1b connected between the node DV and VSS and in parallel to the capacitor, wherein the second circuit includes an inverter having an input connected to the node PORB and an output connected to the base of the transistor NS1b.

Embodiments may include one or more of the following advantages. The disclosed power-on reset circuit can provide reliable performance during fast power cycles, thus overcoming the above-described malfunction problem during fast power cycles in some conventional power-on reset circuits. The disclosed power-on reset circuit may be implemented with simple circuit layouts. Moreover, the disclosed power-on reset circuit has substantially no DC current during device operations, which represents an improvement over some conventional analog POR circuits using fixed current bias. Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION

Figure 3:
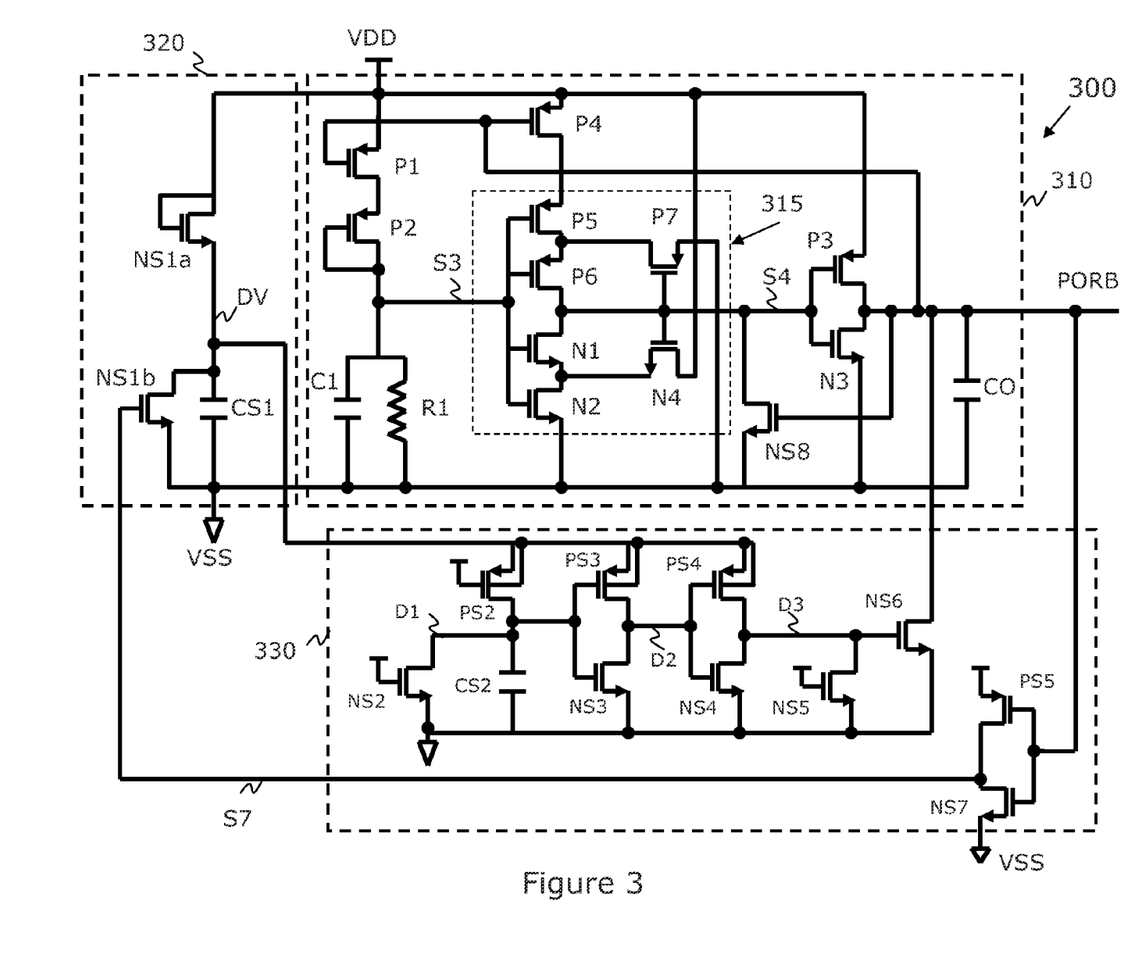
FIG. 3 is a schematic diagram of a power-on reset circuit in accordance with the present application.

A power-on reset circuit 300 is shown in FIG. 3 to address the above described problems in the conventional POR circuits. The power-on reset circuit 300 includes functional blocks 310, 320, and 330. In the present specification, the term "power on" is used synonymous to "power up". Both "power on" and "power up" refer to the period when power is turned on at to supply power and thus increase voltage at the high voltage supply terminal (e.g. VDD).

The block 310 includes two cascoded PMOS transistors P1 and P2, an RC circuit formed by R1 and C1 connected between the low voltage terminal VSS (which can be grounded) and the transistors P1 and P2, and a Schmitt trigger 315 formed by PMOS transistors P5/P6/P7 and NMOS transistors N1/N2/N4. When VDD rises from zero, the node S3 follows VDD to rises with a RC time delay. When VDD reaches a hysteretic threshold VTH1, PORB changes from logic low to logic high. PMOS transistors P1/P4 are shut off, which shuts the flow of any substantial direct DC current flow in the block 310. Power consumption is thus minimized. An NMOS transistor NS8 is added to provide further clamping function to minimize voltage fluctuations at the PORB node when the node PORB changes from logic low to logic high. A stabilization capacitor CO is connected between the node PORB and VSS.

The block 320 includes a diode-connected NMOS transistor NS1a, an NMOS transistor NS1b, and a capacitor CS1. The NMOS transistor NS1a is connected with an NMOS transistor NS1b and a capacitor CS1 at a node DV. The block 320 can hold the node DV at a pre-determined voltage during power-on. The pre-determined voltage can provide the block 330 as a supply voltage.

The block 330 includes transistors PS2/NS2 that form a voltage divider, three inverters respectively formed by transistors PS3/NS3, PS4/NS4 and PS5/NS7 (the inverters PS5/NS7 can also be categorized as a part of the block 320), a clamping transistor NS5, a pull-down transistor NS6, and a capacitor CS2 for storing charges during power off. The block 330 can reset the voltage at the PORB node to zero voltage during power off. DV is the power source supplied to block 330. DV is equal to VDD−VTHN where VTHN is the threshold diode-drop voltage for the transistor NS1a.

The operations of the POR circuit 300 are described below in three phases: $1^{st}$ time power on; $1^{st}$ time power off; and $2^{nd}$ time power on.

The initial states of all the nodes in the POR circuit 300 are assumed to be at zero voltage. When the power is turned on, VDD rises from zero voltage. PMOS transistors P1 and P4 in the block 310 are turned on. P2 is turned on when VDD rises above its threshold voltage. A current then flows through P1 and P2 to charge up C1 and develop a voltage across the resistor R1. The voltage at the node S3 follows VDD with a time delay characterized by the RC constant of the RC circuit formed by R1 and C1. The PMOS transistor P2 further produces a diode drop voltage from VDD to the node S3.

As P4 is turned on, the Schmitt trigger 315 can operate during power on. Since the node S3 is initially zero voltage, the voltage at the node S4 rises, closely following VDD, which turns on N3, which in turn clamps the node PORB to zero voltage during power on. The capacitor C0 acts as a stabilization capacitor that can minimize voltage fluctuations at the node PORB.

When VDD further rises, the S3 voltage can rise and reach the threshold voltage of the Schmitt trigger circuit. As a result, the NMOS transistors N1 and N2 are turned and pull the S4 voltage from logic high to logic low, which can further turn on P3 and shut off N3. The PORB node thus changes from logic low to logic high, following the rise of VDD.

Figure 4:
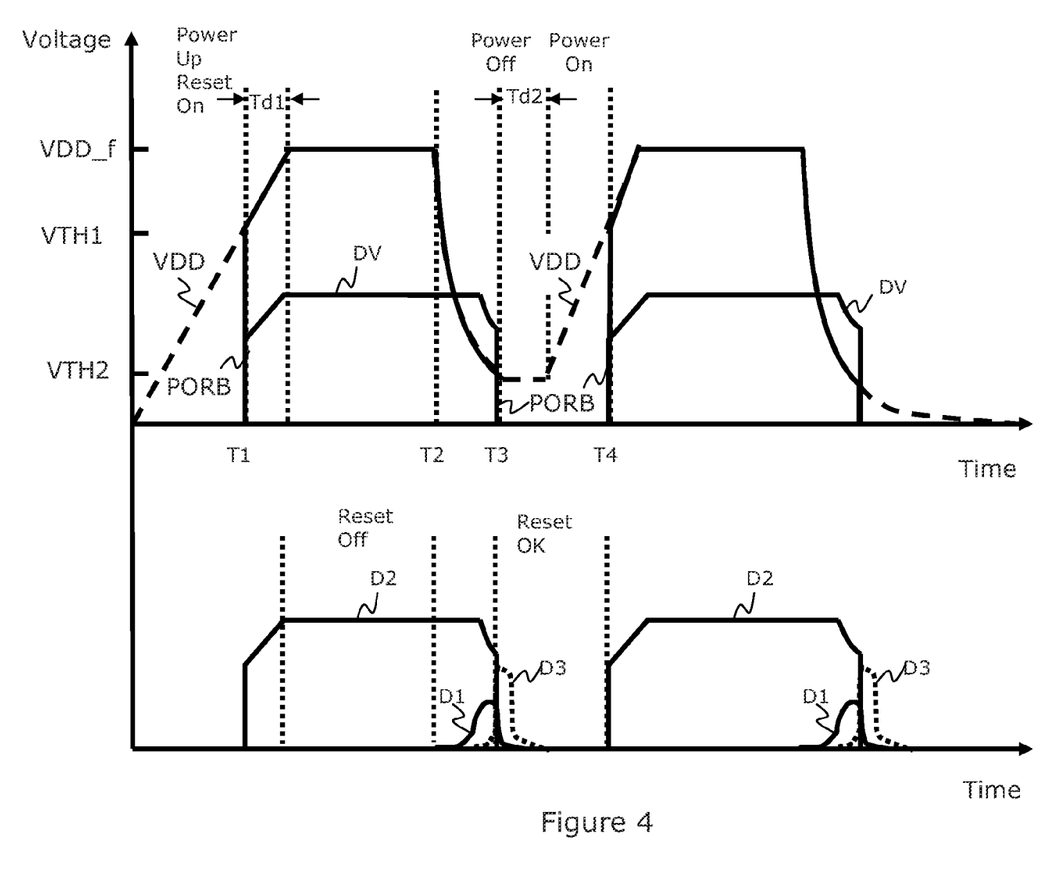
FIG. 4 illustrates a voltage waveform during quick power cycling in the power-on circuit of FIG. 3.

Referring to FIG. 4, voltage waveforms during the power-on operation can be categorized by six phases: 0 to T1, T1 to T1+Td1, T1+Td1 to T2, T2 to T3, T3 to T3+Td2 and T3+Td2 to T4. T1 is the reset on time before which the PORB stays at zero voltages and VDD rises. PORB steps up from logic low to logic high at T1 when VDD reaches a threshold voltage VTH1 at which time S3 reaches the turn-on threshold of the Schmitt trigger circuit 315. After PORB changes to logic high, the reset signal is off; internal latches or flip-flops in the electronic device can operate. The states at which PORB stays at logic low can be defined as "RESET ON". The states at which PORB stays at logic high can be said as "RESET OFF".

As long as VDD is stable at VDD_f, the PORB node remains at a logic-high voltage. The reset signal PORB to internal logic stays at a logic-high voltage. NS8 acts as a clamping transistor to further clamp the PORB node to logic high since once PORB is at logic high, NS8 is turned and further turn on P3 to drive PORB harder to logic high.

The block 320 also functions operation during a power-on. During power on, a current flows from VDD node to capacitor CS1 through the diode-connected NMOS transistor NS1a. NS1b is initially shut off with low voltages at the nodes DV and S7. When VDD stays at a steady high value (VDD_f), for example, 3.3V, the voltage at the node DV rises to a voltage VDD−VTHN, where VTHN is the diode drop voltage of NS1a. If VTHN=~0.6V, then DV is at 3.3V−0.6V=2.7V. The voltage waveform for DV is shown in FIG. 4.

In the block 330, PS2 is shut off because its gate voltage is at VDD and its source voltage is at DV (equal to VDD−VTHN). In order to turn on PS2, its gate node has to be lower than its source node by VTHP or more. Since |VTHP| is larger than |VTHN| for a typical circuit fabrication technology. PS2 is always safely turned off in this case even though NS2 is always turned on. NS2's function is to provide a start-up and valid logic condition for node D1.

When D1 is at a logic low, the PMOS transistor PS3 is turned on, which brings D2 to logic high which is about the voltage of DV since the source of PS3 is connected to DV. (As PS3 is ON most of the time, except during power-off d, D2 always follows DV with a slight time delay, as shown in FIG. 4.) The high logic voltage at D2 can turn on the NS4 and pulls D3 to logic low. The gate node of NS5 is connected to VDD. NS5 is turned on during power-on. NS5 provides a valid start-up and a logic low to the node D3 to prevent NS6 from being accidentally turned on during power-on (which can pull PORB to logic low). NS2 and NS5 can provide start-up conditions. NS2 and NS5 are made with very small sizes so that they do not affect the normal operations during power-off. The block 330 therefore does not affect the voltage at the node PORB during power-on.

$1^{st}$ time power-off

The power-off sequence begins when VDD starts to drop at time T2. As shown in FIG. 4. VDD decreases approximately following an exponential decay curve characterized by an RC time constant. The resistance and the capacitance in the RC constant are respectively defined by the on-chip and off-chip parasitic resistance/capacitance and resistance/capacitance connected between VDD and VSS. The on-chip resistance/capacitance is the parasitic resistance/capacitance and decoupling capacitance which connects between VDD and VSS internally. The off-chip resistance/capacitance is the resistance/capacitance and decoupling capacitance which connects between VDD pin and VSS pin externally like the traces in PCB, parasitic resistance from bonding leads and those decoupling capacitors for power supply stabilization. As described the above, VDD decreases rather rapidly at the beginning until it reaches around VTH2 (~0.5-0.6V). The rate of voltage decrease slows down significantly because of the exponential decay curve and parasitic diodes in the POR circuit 300 are clamped at their diode voltages during powers off. The DV voltage remains unchanged at the beginning of the power off. After VDD drops below DV, DV can hold constant for a while and then gradually decreases while maintaining a diode voltage above VDD.

Since the DV voltage is now higher than VDD by a diode drop, PS2 in the block 330 is partially turned on to allow current to flow into capacitor CS2 to charge it up. PS2 and NS2 form a voltage divider as NS2 is always turned on. PS2 is made with a large size and NS2 is made much smaller. The voltage at the node D1 can gradually increase to a point when it can turn on NS3. CS2 can be made moderate to suit the design needs. When the D1 voltage is high enough to turn on NS3, D2 becomes logic low, which further turns on PS4 and pulls D3 to logic high (i.e. the DV voltage). NS5 and PS4 form a voltage divider. PS4 can be made large and NS5 made much smaller so that the D3 voltage is high enough to turn on NMOS transistor NS6. Once NS6 is turned on, it can discharge PORB to zero voltage during power-off as show in FIG. 4.

The block 330 can be triggered when PS2 is turned on. As described the above, the voltage to turn on PS2 is when the gate node of PS2 is lower than the source node, (at DV) by |VTHP| or more. The DV voltage is at about VDD−VTHN.

So PS2 can turn on when the gate node of PS2 is about VDD−VTHN−|VTHP|.NS3/PS4 and NS6 can be subsequently turned on in sequence to complete the operation. Practically, as VDD decreases, there are delays between the nodes D1/D2/D3. The final threshold voltage is slightly lower than the theoretical voltage. However, the higher the VDD (say from 3.3V to 5.0V), the higher the triggering threshold is during power-off is. For VDD=1.8V, VTHN=~0.6V and |VTHP|=~0.7V, then the threshold VTH2=1.8V−0.6V−0.7V=0.5V.

$2^{nd}$ time power-on

As shown in FIG. 4, if the time between T3 and T4 is very short, VDD has not dropped to zero voltage before the next power cycle begins. In contrast to some conventional POR circuits, the PORB node has already been discharged to zero voltage before VDD starts to rise again. As PORB starts from zero voltage, PMOS transistor P1 and P4 in the block 310 can function properly. The POR circuit 300 can produce a power-on sequence similar to the first power on as described above. The node PORB during second power-on is initially at zero voltage. SPS5 is gradually turned on as VDD increases. NS1b is next turned on to discharge the residual charges in capacitor CS1 from the previous power cycle. When PORB changes from logic low to logic high, NS7 is turned on shutting off NS1b. The capacitor CS1 can then be charged up through NS1a in a short period of time and the charge is always kept there at node DV as NS1a is always turned on. The discharge of CS1 is necessary to ensure CS1 to be accurately charged up to VDD-VTHN in every power-on sequence. Once DV reaches a well-defined voltage, the power-off cycle can operate correctly as described above about the first power-on.

The disclosed circuits and methods may have one or more of the following advantages. The disclosed POR circuit can reset its output to zero voltage during power-off to ensure proper start-up for the next power-on sequence. At the same time, the disclosed POR circuit does not have a DC current path from VDD to VSS when VDD is stable so that power consumption is minimized. A Schmitt trigger circuit in the disclosed POR circuit can minimize voltage fluctuations at the VDD during power-on.

It is understood that the disclosed circuit and methods are compatible with other configurations of the electronic components and variations in circuit designs without deviation from the spirit of the present specification. Various forms of resistors, capacitors, transistors, and amplifiers can be used to achieve similar results as described above. The inverter and the feedback circuits can be based on other logic gate designs that are Boolean equivalents to what is disclosed above. For example, NS1a can be replaced by a diode-connected PMOS transistor or similar diode configurations R1 and C1 can be replaced by a resistive divider. The Schmitt trigger circuit can be replaced by a circuit that can perform similar functions.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. A power-on reset circuit, comprising:
   a first circuit arranged between a high voltage supply terminal (VDD) and a low voltage supply terminal (VSS), wherein the first circuit is configured to output a low-voltage reset signal at an output node when VDD is powered up and to output a high voltage signal at the output node after the VDD reaches a predetermined voltage during power up, wherein the first circuit comprises a transistor connected between VDD and a node S3, an R-C circuit connected between the node S3 and VSS, and a Schmitt trigger circuit configured to change the voltage at the output node in response to the voltage at the node S3;
   a second circuit configured to set the output node to a low voltage after VDD is powered off; and
   a third circuit configured to provide a supply voltage at a node DV to the second circuit, wherein the supply voltage is lower than the voltage of VDD by approximately one diode voltage.

2. The power-on reset circuit of claim 1, wherein the Schmitt trigger circuit is triggered by the voltage at the node S3 to change the voltage at the output node when VDD reaches a predetermined voltage during power on.

3. The power-on reset circuit of claim 1, wherein the first circuit further comprises:
   a diode connected between the transistor and the node S3; and
   an inverter having an output connected to the output node and an input connected to an output of the Schmitt trigger circuit.

4. A power-on reset circuit of claim 1, wherein the first circuit further comprises a capacitor CO connected between the output node and VSS.

5. The power-on reset circuit of claim 1, wherein the second circuit comprises:
   a voltage divider configured to output as a node D1 a divided voltage that is a fraction of the supply voltage at the node DV; and
   a pull-down transistor connected between the output node and VSS, the pull-down transistor being configured to pull the output node to a low voltage in response to the divided voltage at the node D1 after VDD is powered off.

6. The power-on reset circuit of claim 5, wherein the voltage divider in the second circuit is formed by two transistors connected at the node D1 and between the node DV and VSS.

7. The power-on reset circuit of claim 5, wherein the second circuit further comprise one or more sequentially-connected inverters having an input connected to the node D1 and an output connected to the base of the pull-down transistor.

8. The power-on reset circuit of claim 5, wherein the second circuit further comprises a clamping transistor NS5 connected between the base of the pull-down transistor and VSS, wherein the base of the clamping transistor NS5 is supplied with the supply voltage at the node D1.

9. The power-on reset circuit of claim 1, wherein the second circuit further comprises a capacitor CS2 connected between VSS and the node D1 and configured to store charges when VDD is powered off.

10. The power-on reset circuit of claim 1, wherein the third circuit comprises:
    a diode connected between VDD and the node DV; and
    a capacitor CS1 connected between the node DV and VSS.

11. The power-on reset circuit of claim 10, wherein the diode is a diode-connected transistor NS1a.

12. The power-on reset circuit of claim 10, wherein the third circuit further comprises a transistor NS1b connected between the node DV and VSS and in parallel to the capacitor CS1, wherein the second circuit includes an inverter having an input connected to the output node and an output connected to the base of the transistor NS1b.

13. A power-on reset circuit, comprising:
    a first circuit arranged between a high voltage supply terminal (VDD) and a low voltage supply terminal (VSS), wherein the first circuit is configured to output a low-voltage reset signal at an output node when VDD is powered up and to output a high voltage signal at the output node after the VDD reaches a predetermined voltage during power up;

a second circuit comprising:
   a voltage divider configured to output at a node D1 a divided voltage that is a fraction of the supply voltage at a node DV; and
   a pull-down transistor connected between the output node and VSS, the pull-down transistor being configured to pull the output node to a low voltage in response to the divided voltage at the node D1 after VDD is powered off; and a third circuit comprising:
   a diode connected between VDD and the node DV; and
   a capacitor CS1 connected between the node DV and VSS, wherein the third circuit is configured to provide a supply voltage at the node DV to the second circuit.

14. The power-on reset circuit of claim 13, wherein the first circuit comprises:
   a transistor connected between VDD and a node S3;
   an R-C circuit connected between the node S3 and VSS; and
   a Schmitt trigger circuit configured to change the voltage at the output node in response to the voltage at the node S3.

15. The power-on reset circuit of claim 14, wherein the Schmitt trigger circuit is triggered by the voltage at the node S3 to change the voltage at the output node when VDD reaches a predetermined voltage during power on.

16. The power-on reset circuit of claim 15, wherein the first circuit further comprises:
   an inverter having an output connected to the output node and an input connected to an output of the Schmitt trigger circuit; and
   a capacitor CO connected between the output node and VSS.

17. The power-on reset circuit of claim 13, wherein the second circuit further comprise:
   one or more sequentially-connected inverters having an input connected to the node D1 and an output connected to the base of the pull-down transistor;
   a clamping transistor NS5 connected between the base of the pull-down transistor and VSS, wherein the base of the clamping transistor NS5 is supplied with the supply voltage at the node D1; and
   a capacitor CS2 connected between VSS and the node D1 and configured to store charges when VDD is powered off.

18. The power-on reset circuit of claim 13, wherein the third circuit further comprises a transistor NS1b connected between the node DV and VSS and in parallel to the capacitor CS1, wherein the second circuit includes an inverter having an input connected to the output node and an output connected to the base of the transistor NS1b.

19. A power-on reset circuit, comprising:
   a first circuit configured to output a low-voltage reset signal at an output node when a high voltage supply terminal (VDD) is powered up and to output a high voltage signal at the output node after the VDD reaches a predetermined voltage during power up;

a second circuit comprising:
   a voltage divider configured to output at a node D1 a divided voltage that is a fraction of the supply voltage at a node DV; and
   a pull-down transistor connected between the output node and a low voltage supply terminal (VSS), the pull-down transistor being configured to pull the output node to a low voltage in response to the divided voltage at the node D1 after VDD is powered off; and a third circuit comprising:
   a diode connected between VDD and the node DV;
   a capacitor CS1 connected between the node DV and VSS; and
   a transistor NS1b connected between the node DV and VSS and in parallel to the capacitor, wherein the third circuit is configured to provide a supply voltage at the node DV to the second circuit; and an inverter having an input connected to the output node and an output connected to the base of the transistor NS1b to allow capacitor CS1 to be discharged when the output node is at a low voltage.

* * * * *